United States Patent
Murayama et al.

(10) Patent No.: US 6,765,449 B2
(45) Date of Patent: Jul. 20, 2004

(54) PULSE WIDTH MODULATION CIRCUIT

(75) Inventors: Kazutaka Murayama, Osaka (JP); Sadatoshi Hisamoto, Osaka (JP); Norio Umezu, Osaka (JP); Yoshitaka Handa, Osaka (JP); Shuichi Hiza, Tokyo (JP)

(73) Assignee: Onkyo Corporation, Osaka (JP)

( * ) Notice: Subject to any disclaimer, the term of this patent is extended or adjusted under 35 U.S.C. 154(b) by 0 days.

(21) Appl. No.: 10/368,695

(22) Filed: Feb. 19, 2003

(65) Prior Publication Data

US 2003/0160661 A1 Aug. 28, 2003

(30) Foreign Application Priority Data

Feb. 22, 2002 (JP) .......................................... 2002-45594

(51) Int. Cl.[7] .............................................. H03K 7/08
(52) U.S. Cl. ..................................... 332/109; 332/110
(58) Field of Search .................. 332/109–111; 327/172, 327/175, 176

(56) References Cited

U.S. PATENT DOCUMENTS 5,030,847 A * 7/1991 Gotoh et al. ................. 327/176

FOREIGN PATENT DOCUMENTS

JP 49-87262 8/1974

* cited by examiner

*Primary Examiner*—David Mis
(74) *Attorney, Agent, or Firm*—Renner, Otto, Boisselle & Sklar, LLP

(57) ABSTRACT

A pulse width modulation circuit of the present invention includes: pulse generation means being provided with a first power supply and charged with a first current and a second current between which a constant current is distributed to turn ON/OFF a switching element, thereby generating a pulse from a first output section; pulse modulation means for controlling the charging while controlling a distribution ratio between the first current and the second current based on an input signal, thereby changing a pulse width of the output pulse; and first short circuit means for shorting the first output section with the first power supply when the pulse being output from the first output section transitions to a voltage of the first power supply.

13 Claims, 7 Drawing Sheets

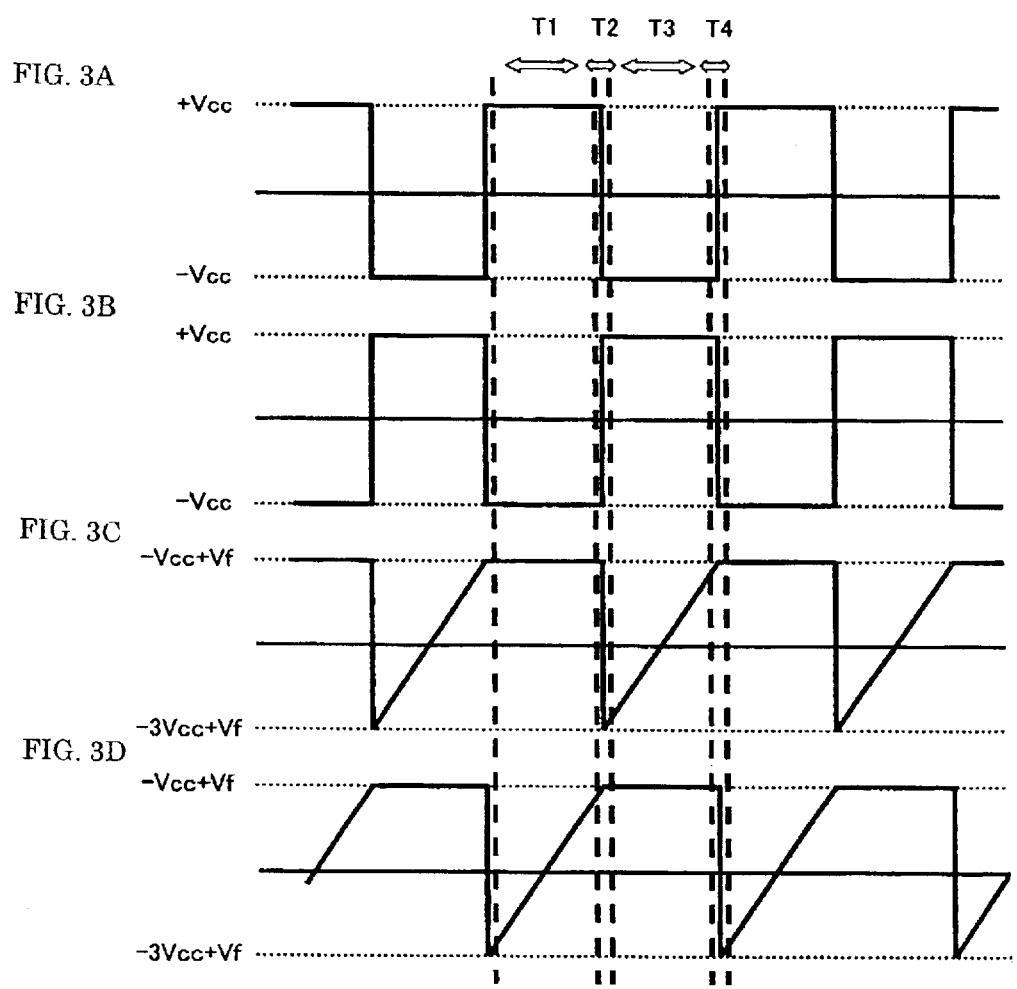

PULSE WIDTH MODULATION CIRCUIT

BACKGROUND OF THE INVENTION

1. Field of the Invention

The present invention relates to a pulse width modulation circuit, and more particularly to a pulse width modulation circuit capable of outputting pulses having a sharp rising edge and a sharp falling edge.

2. Description of the Related Art

FIG. 6 is a circuit diagram illustrating a conventional pulse width modulation circuit 61. FIG. 7A and FIG. 7B are waveform diagrams illustrating the output of the pulse width modulation circuit 61, wherein FIG. 7A illustrates the output from an output section a, and FIG. 7B illustrates the output from an output section b. In the pulse width modulation circuit 61, transistors TR61 and TR62 are alternately turned ON/OFF by charging/discharging condensers C61 and C62, thereby outputting pulses from the output sections a and b. An audio signal is input to the base of a transistor TR63 to control the ratio between a collector current I61 of the transistor TR63 and a collector current I62 of a transistor TR64, thereby controlling the charging time of the condensers C61 and C62 to change the output pulse width.

FIG. 8 is a circuit diagram illustrating another conventional pulse width modulation circuit 81. FIG. 9A and FIG. 9B are waveform diagrams illustrating the output of the pulse width modulation circuit 81. The operation of the pulse width modulation circuit 81 is basically the same as that of the pulse width modulation circuit 61 of FIG. 6, except that the polarities of the power supplies and the transistors are inverted.

A problem with the conventional pulse width modulation circuit 61 is the dull rising edge of the output pulses, as illustrated in FIG. 7A and FIG. 7B, thereby failing to obtain pulses that precisely correspond to the input signal. Therefore, the pulse width modulation circuit 61, when employed in an audio circuit, may deteriorate the sound quality or cause distortion. Specifically, the potential at the output section a transitions from −Vcc to +Vcc immediately after the transistor TR61 transitions from ON to OFF. However, since the output section a is connected to the power supply +Vcc via a resistor R61, the transition of the potential at the output section a to +Vcc is gradual, thereby resulting in a dull rising edge as illustrated in FIG. 7A. On the other hand, the potential at the output section b transitions from −Vcc to +Vcc immediately after the transistor TR62 transitions from ON to OFF. However, since the output section b is connected to the power supply +Vcc via a resistor R62, the transition of the potential at the output section b to +Vcc is gradual, thereby resulting in a dull rising edge as illustrated in FIG. 7B.

Similarly, a problem with the pulse width modulation circuit 81 is the dull falling edge of the output pulses, as illustrated in FIG. 9A and FIG. 9B, for the same reason as that for the pulse width modulation circuit 61.

SUMMARY OF THE INVENTION

It is an object of the present invention to provide a pulse width modulation circuit capable of outputting pulses having a sharp rising edge and a sharp falling edge.

In one embodiment of the present invention, a pulse width modulation circuit includes: pulse generation means being provided with a first power supply and charged with a first current and a second current between which a constant current is distributed to turn ON/OFF a switching element, so as to generate a pulse from a first output section; pulse modulation means for controlling the charging by controlling a distribution ratio between the first current and the second current based on an input signal, so as to change a pulse width of the output pulse according to a charging time; and first short circuit means for shorting the first output section with the first power supply when the pulse being output from the first output section transitions to a voltage of the first power supply.

Thus, the potential at the first output section can be brought to the first power supply voltage instantaneously. Therefore, the rising (or falling) edge of the pulse output from the first output section, which would otherwise be dull, can be made very sharp.

In a preferred embodiment, the pulse generation means includes a first switching element connected to the first output section, and a second switching element; and the first short circuit means includes a third switching element between the first output section and the first power supply, the first short circuit means shorting the first output section with the first power supply by turning ON the third switching element.

Thus, when the pulse being output from the first output section transitions to the first power supply voltage, the first output section and the first power supply can be shorted with each other by turning ON the third switching element.

In a preferred embodiment, the third switching element is turned ON in response to the second switching element being turned ON, and the third switching element is turned OFF in response to the second switching element being turned OFF.

Thus, when the pulse being output from the first output section transitions to the first power supply voltage, the first output section and the first power supply can reliably be shorted with each other. Moreover, since the third switching element is turned OFF in response to the second switching element being turned OFF, the first switching element and the third switching element will not be ON at the same time. Therefore, it is possible to prevent a switching element from being damaged by a through current from the first power supply.

In a preferred embodiment, the third switching element is a transistor; and a base of the third switching element is connected between the second switching element and the first power supply, an emitter thereof is connected to the first power supply, and a collector thereof is connected between the first switching element and the first power supply.

Thus, based on whether the second switching element is ON or OFF, the base-emitter voltage of the third switching element is determined, so as to turn ON or OFF the third switching element.

In a preferred embodiment, the pulse generation means further includes a second output section, wherein the pulse generation means is charged with the first current and the second current to turn ON/OFF a switching element, so as to generate a pulse from the second output section; and the pulse width modulation circuit further includes second short circuit means for shorting the second output section with the first power supply when the pulse being output from the second output section transitions to a voltage of the first power supply.

Thus, the potential at the second output section can also be brought to the first power supply voltage instantaneously. Therefore, the rising (or falling) edge of the pulse output from the second output section, which would otherwise be dull, can be made very sharp.

In a preferred embodiment, the pulse generation means includes a first switching element connected to the first output section, and a second switching element connected to the second output section; the first short circuit means includes a third switching element between the first output section and the first power supply, the first short circuit means shorting the first output section with the first power supply by turning ON the third switching element; and the second short circuit means includes a fourth switching element between the second output section and the first power supply, the second short circuit means shorting the second output section with the first power supply by turning ON the fourth switching element.

Thus, when the pulse being output from the second output section transitions to the first power supply voltage, the second output section and the first power supply can be shorted with each other by turning ON the fourth switching element.

In a preferred embodiment, the third switching element is turned ON in response to the second switching element being turned ON, and the third switching element is turned OFF in response to the second switching element being turned OFF; and the fourth switching element is turned ON in response to the first switching element being turned ON, and the fourth switching element is turned OFF in response to the first switching element being turned OFF.

Thus, since the fourth switching element is turned ON in response to the first switching element being turned ON, the second output section and the first power supply can reliably be shorted with each other when the pulse being output from the second output section transitions to the first power supply voltage. Moreover, since the fourth switching element is turned OFF in response to the first switching element being turned OFF, the second switching element and the fourth switching element will not be ON at the same time. Therefore, it is possible to prevent a switching element from being damaged by a through current from the first power supply.

In a preferred embodiment, the third switching element is a transistor; a base of the third switching element is connected between the second switching element and the first power supply, an emitter thereof is connected to the first power supply, and a collector thereof is connected between the first switching element and the first power supply; the fourth switching element is a transistor; and a base of the fourth switching element is connected between the first switching element and the first power supply, an emitter thereof is connected to the first power supply, and a collector thereof is connected between the second switching element and the first power supply.

Thus, based on whether the first switching element is ON or OFF, the base-emitter voltage of the fourth switching element is determined, so as to turn ON or OFF the fourth switching element.

In a preferred embodiment, the pulse generation means includes an astable multivibrator.

In a preferred embodiment, the pulse generation means is provided further with a second power supply; and the voltage of the first power supply is set to be higher than that of the second power supply.

Thus, the rising edge of the pulse output from the first output section can be made very sharp.

In a preferred embodiment, the pulse generation means is provided further with a second power supply; and the voltage of the first power supply is set to be lower than that of the second power supply.

Thus, the falling edge of the pulse output from the first output section can be made very sharp.

In a preferred embodiment, the pulse generation means is provided further with a second power supply, and includes a first transistor, a second transistor, a first condenser and a second condenser; a collector of the first transistor is connected between one end of the first condenser and the first power supply, an emitter thereof is connected to the second power supply, and a base thereof is connected to one end of the second condenser; and a collector of the second transistor is connected between the other end of the second condenser and the first power supply, an emitter thereof is connected to the second power supply, and a base thereof is connected to the other end of the first condenser.

In a preferred embodiment, the pulse modulation means includes: a constant current circuit for generating a constant current; a fifth transistor for receiving the input signal at its base to control the first current; and a sixth transistor for controlling the second current based on the first current.

BRIEF DESCRIPTION OF THE DRAWINGS

FIG. 3A to FIG. 3D are waveform diagrams illustrating the operation of the pulse width modulation circuit according to the preferred embodiment of the present invention.

DETAILED DESCRIPTION OF THE PREFERRED EMBODIMENTS

Figure 1:
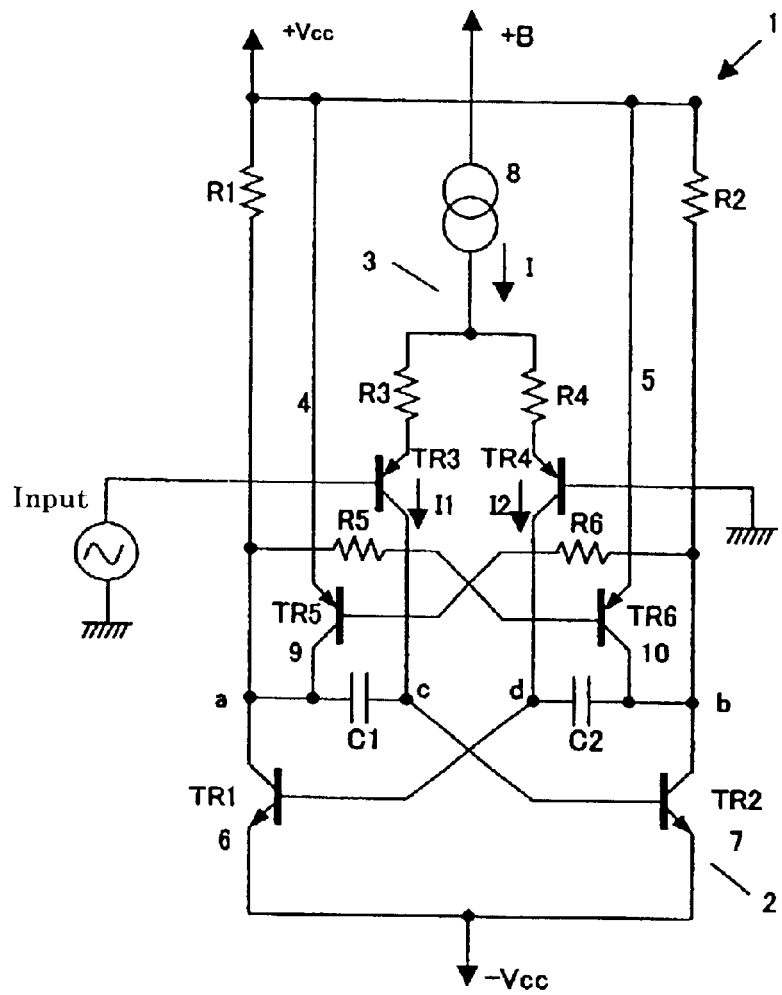
FIG. 1 is a schematic circuit diagram illustrating a pulse width modulation circuit according to a preferred embodiment of the present invention.

Preferred embodiments of the present invention will now be described with reference to the accompanying drawings. Note however that the present invention is not limited to the particular embodiments set forth below. While the following embodiment is directed to sharpening of the rising edge of a pulse, the falling edge of a pulse may be sharpened in a similar manner. FIG. 1 is a circuit diagram illustrating a pulse width modulation circuit 1 according to a preferred embodiment of the present invention. The pulse width modulation circuit 1 includes pulse generation means 2, pulse modulation means 3 and first short circuit means 4. The pulse width modulation circuit 1 may further include second short circuit means 5 as necessary (e.g., where pulses are output also from a second output section b to be described later).

The pulse generation means 2 charges condensers with a first current I1 and a second current I2 to be described later to turn ON/OFF a first switching element 6 and a second switching element 7, thereby outputting a pulse from a first output section a. As necessary, a pulse may be output also from the second output section b. Specifically, the pulse generation means 2 generates a pulse that has a width corresponding to the condenser charging time. The pulse generation means 2 may typically be an astable multivibrator. For example, an astable multivibrator includes the first switching element 6 (e.g., a transistor TR1), a second switching element 7 (e.g., a transistor TR2), resistors R1 to R4, condensers C1 and C2, and the output sections a and b. The collector (the output section a) of the transistor TR1 is connected to a first power supply (+Vcc in the present embodiment) via the resistor R1, and to one end of the condenser C1. The emitter of the transistor TR1 is connected to a second power supply (−Vcc in the present embodiment), and the base of the transistor TR1 is connected to one end of the condenser C2. The collector (the output section b) of the transistor TR2 is connected to the first power supply +Vcc via the resistor R2, and to the other end of the condenser C2. The emitter of the transistor TR2 is connected to the second power supply −Vcc, and the base of the transistor TR2 is connected to the other end of the condenser C1. The voltage of the first power supply is set to be higher than that of the second power supply.

Figure 2:
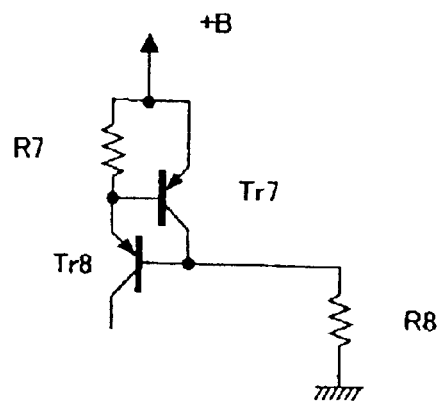
FIG. 2 is a circuit diagram illustrating an example of a constant current circuit.

The pulse modulation means 3 controls the distribution ratio between the first current I1 and the second current I2 based on the input signal to change the pulse width of the output pulse. The pulse modulation means 3 includes a constant current circuit 8, and transistors TR3 and TR4. The constant current circuit 8 generates a constant current I, and is, for example, a circuit as illustrated in FIG. 2, though not limited thereto. The first current I1 is the collector current of the transistor TR3, and the second current I2 is the collector current of the transistor TR4. The sum of the first current I1 and the second current I2 is equal to the constant current I generated by the constant current circuit 8. In other words, the constant current I is distributed between the first current I1 and the second current I2. The transistor TR3 receives the input signal at its base to control the current amount of the first current I1. With the first current I1 being controlled, the transistor TR4 controls the current amount of the second current I2. Thus, the distribution ratio between the first current I1 and the second current I2 is controlled. Then, the charging time of the condensers C1 and C2 is controlled, thereby changing the output pulse width.

The first short circuit means 4 shorts the first output section a with the first power supply +Vcc when the pulse being output from the first output section a transitions to the first power supply voltage +Vcc (i.e., at the rising edge in the present embodiment). Specifically, the first output section a and the first power supply +Vcc are shorted with each other while the pulse being output from the first output section a is at the first power supply voltage +Vcc. In other words, the first output section a and the first power supply +Vcc are connected directly to each other with no resistor therebetween while the transistor TR1 is OFF. The first short circuit means 4 includes a third switching element 9 between the first output section a and the first power supply +Vcc (i.e., in parallel to the resistor R1). While the third switching element 9 may be any suitable switching element, it may typically be a transistor TR5. The base of the transistor TR5 is connected to the second output section b via a resistor R6, for example. The emitter of the transistor TR5 is connected to the first power supply +Vcc, and the collector thereof is connected to the first output section a. Preferably, a further condenser (not shown) is connected in parallel to the resistor R6 to increase the speed at which the transistor TR5 is turned ON.

The second short circuit means 5 shorts the second output section b with the first power supply +Vcc when the pulse being output from the second output section b transitions to the first power supply voltage +Vcc (i.e., at the rising edge in the present embodiment). Specifically, the second output section b and the first power supply +Vcc are shorted with each other while the pulse being output from the second output section b is at the first power supply voltage +Vcc. In other words, the second output section b and the first power supply +Vcc are connected directly to each other with no resistor therebetween while the transistor TR2 is OFF. The second short circuit means 5 includes a fourth switching element 10 between the second output section b and the first power supply +Vcc (i.e., in parallel to the resistor R2). While the fourth switching element 10 may be any suitable switching element, it may typically be a transistor TR6. The base of the transistor TR6 is connected to the first output section a via a resistor R5. The emitter of the transistor TR6 is connected to the first power supply, and the collector thereof is connected to the second output section b. Preferably, a further condenser (not shown) is connected in parallel to the resistor R5 to increase the speed at which the transistor TR6 is turned ON.

The operation of the pulse width modulation circuit 1 having such a configuration will now be described with reference to FIG. 1 to FIG. 3D. FIG. 3A to FIG. 3D are waveform diagrams illustrating the operation of the pulse width modulation circuit 1, and correspond to nodes a to d, respectively, of the pulse width modulation circuit 1 illustrated in FIG. 1.

In period T1, the transistor TR1 is OFF, and the potential at the output section a is +Vcc (FIG. 3A), whereas the transistor TR2 is ON, and the potential at the output section b is −Vcc (FIG. 3B). The potential at the node c is −Vcc+Vf (FIG. 3C). The potential at the node d increases from −3Vcc+Vf to −Vcc+Vf (FIG. 3D) as the condenser C2 is charged with the second current I2. Note that Vf is the voltage by which the base-emitter junction of a transistor is forward biased.

In period T2, the potential at the node d reaches −Vcc+Vf, and the base-emitter voltage of the transistor TR1 reaches the voltage Vf, by which the base-emitter junction is forward biased, whereby the transistor TR1 transitions to ON. Thus, the potential at the output section a is −Vcc. The condenser C1 is charged with a voltage of 2Vcc−Vf thereacross immediately before the transition of the transistor TR1, and the potential difference (2Vcc−Vf) across the condenser C1 is kept until a point in time immediately after the transition. Then, the potential at the output section a transitions to −Vcc, whereby the potential at the node c decreases to −3Vcc+Vf (FIG. 3C). Thus, the base-emitter junction of the transistor TR2 is reverse biased, thereby turning OFF the transistor TR2. Therefore, the potential at the output section b transitions to +Vcc (FIG. 3B).

As the transistor TR1 is turned ON, with the potential at the output section a transitioning to −Vcc, the base-emitter voltage of the transistor TR6 transitions to 2Vcc, which is equal to or greater than the voltage Vf, by which the base-emitter junction is forward biased, thus turning ON the transistor TR6. As the transistor TR6 is turned ON, the output section b is brought into electrical connection with the first power supply +Vcc via the transistor TR6. Thus, the output section b is connected to the first power supply +Vcc with no resistor therebetween, thereby realizing an instantaneous transition of the potential at the output section b to +Vcc, and thus very sharp rising of the pulse (FIG. 3B). On the other hand, as the transistor TR2 is turned OFF, and the potential at the output section b transitions to +Vcc, the base-emitter voltage of the transistor TR5 does not reach the forward bias voltage Vf, whereby the transistor TR5 is OFF. Thus, the transistors TR1 and TR5 will not be ON at the same time, thereby preventing a transistor from being damaged by a through current from the first power supply +Vcc to the second power supply −Vcc.

In period T3, the transistor TR2 is OFF, and the potential at the output section b is +Vcc (FIG. 3B), whereas the transistor TR1 is ON, and the potential at the output section a is −Vcc (FIG. 3A). The potential at the node d is −Vcc+Vf (FIG. 3D). The potential at the node c increases from −3Vcc+Vf to −Vcc+Vf (FIG. 3C) as the condenser C1 is charged with the first current I1.

In period T4, the potential at the node c reaches −Vcc+Vf, and the base-emitter voltage of the transistor TR2 reaches the voltage Vf, by which the base-emitter junction is forward biased, whereby the transistor TR2 transitions to ON. Thus, the potential at the output section b is −Vcc. The condenser C2 is charged with a voltage of 2Vcc−Vf thereacross immediately before the transition of the transistor TR2, and the potential difference (2Vcc−Vf) across the condenser C2 is kept until a point in time immediately after the transition. Then, the potential at the output section b transitions to −Vcc, whereby the potential at the node d decreases to −3Vcc+Vf (FIG. 3D). Thus, the base-emitter junction of the transistor TR1 is reverse biased, thereby turning OFF the transistor TR1. Therefore, the potential at the output section a transitions to +Vcc (FIG. 3A).

As the transistor TR2 is turned ON, with the potential at the output section b transitioning to −Vcc, the base-emitter voltage of the transistor TR5 transitions to 2Vcc, which is equal to or greater than the voltage Vf, by which the base-emitter junction is forward biased, thus turning ON the transistor TR5. As the transistor TR5 is turned ON, the output section a is brought into electrical connection with the first power supply +Vcc via the transistor TR5. Thus, the output section a is connected to the first power supply +Vcc with no resistor therebetween, thereby realizing an instantaneous transition of the potential at the output section a to +Vcc, and thus very sharp rising of the pulse (FIG. 3A). On the other hand, as the transistor TR1 is turned OFF, and the potential at the output section a transitions to +Vcc, the base-emitter voltage of the transistor TR6 does not reach the forward bias voltage Vf, whereby the transistor TR6 is OFF. Thus, the transistors TR2 and TR6 will not be ON at the same time, thereby preventing a transistor from being damaged by a through current from the first power supply +Vcc to the second power supply −Vcc.

Figure 4A:
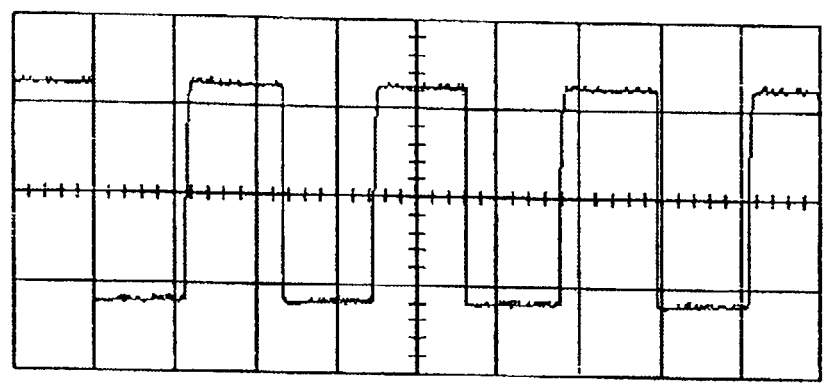
FIG. 4A illustrates simulated output pulses of the pulse width modulation circuit of the present invention.
Figure 4B:
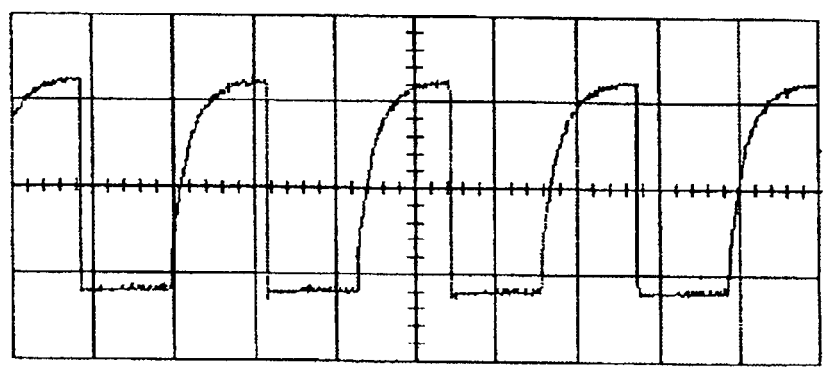
FIG. 4B illustrates simulated output pulses of a conventional pulse width modulation circuit.
Figure 6:
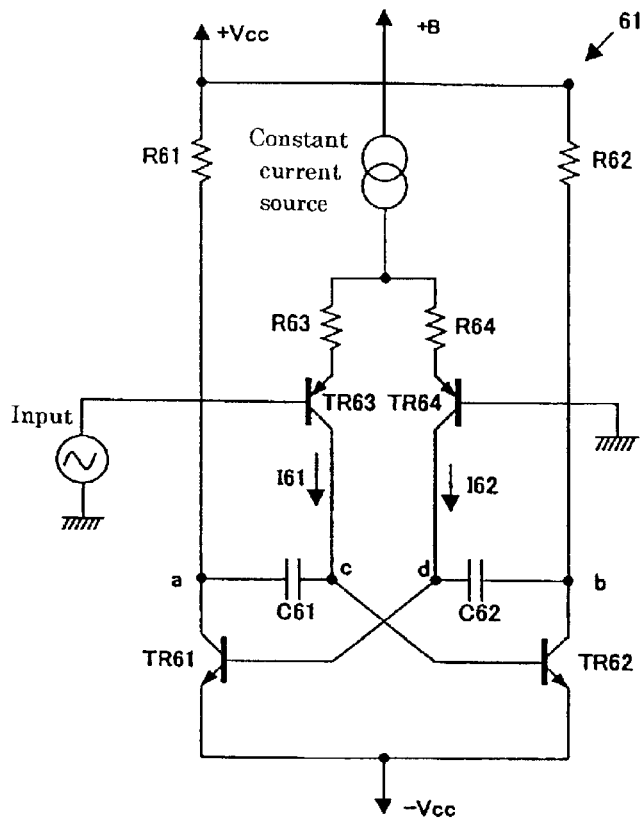
FIG. 6 is a circuit diagram illustrating a conventional pulse width modulation circuit.
Figure 7A:
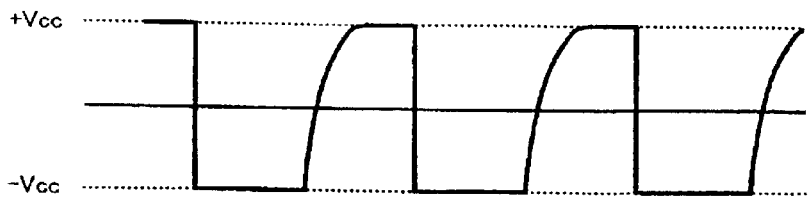
FIG. 7A and FIG. 7B are waveform diagrams illustrating the operation of the conventional pulse width modulation circuit.
Figure 7B:
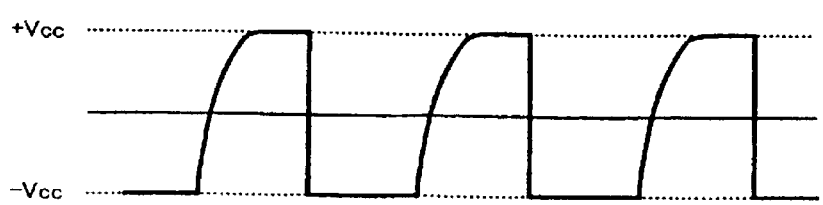

FIG. 4A illustrates the measured pulses output from the output section a of the pulse width modulation circuit 1 of FIG. 1. FIG. 4B illustrates the measured pulses output from the output section a of the conventional pulse width modulation circuit 61 of FIG. 6. In each of FIG. 4A and FIG. 4B, the horizontal axis represents time, and the vertical axis represents the voltage value. As illustrated in FIG. 4A, with the pulse width modulation circuit 1 of the present invention, it is possible to realize a pulse with a very sharp rising edge.

Figure 5:
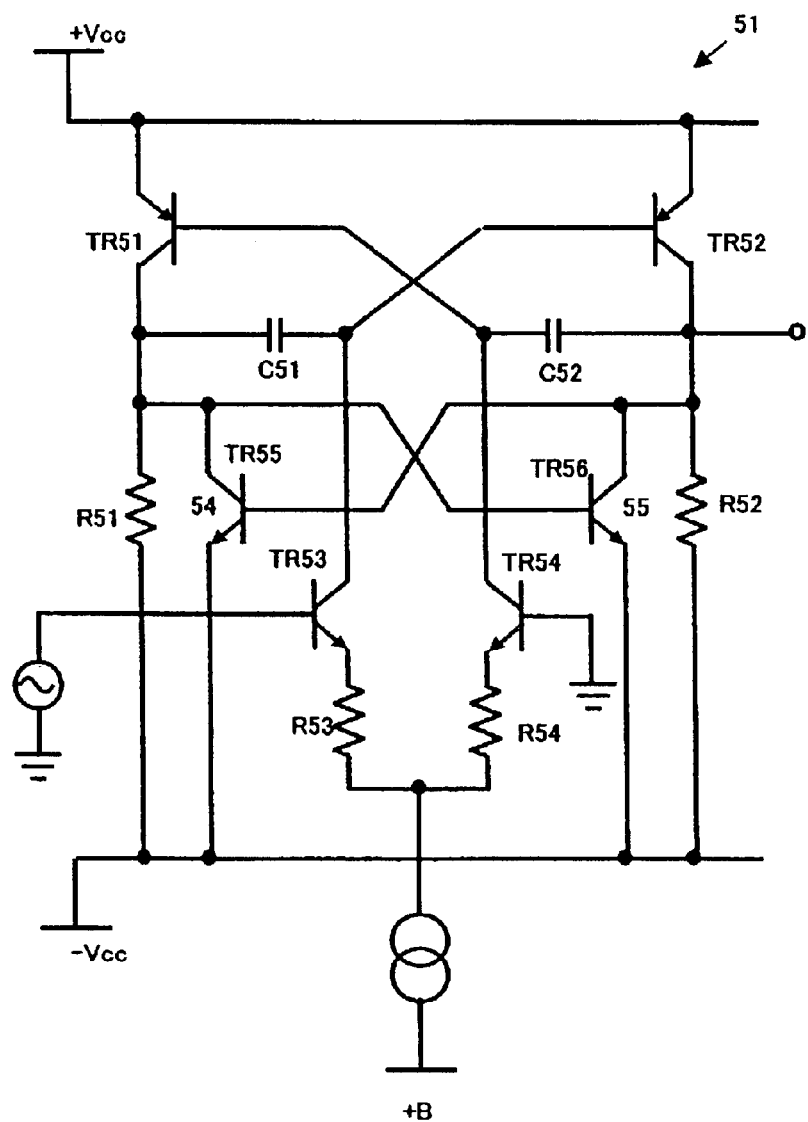
FIG. 5 is a circuit diagram illustrating a pulse width modulation circuit according to another embodiment of the present invention.
Figure 8:
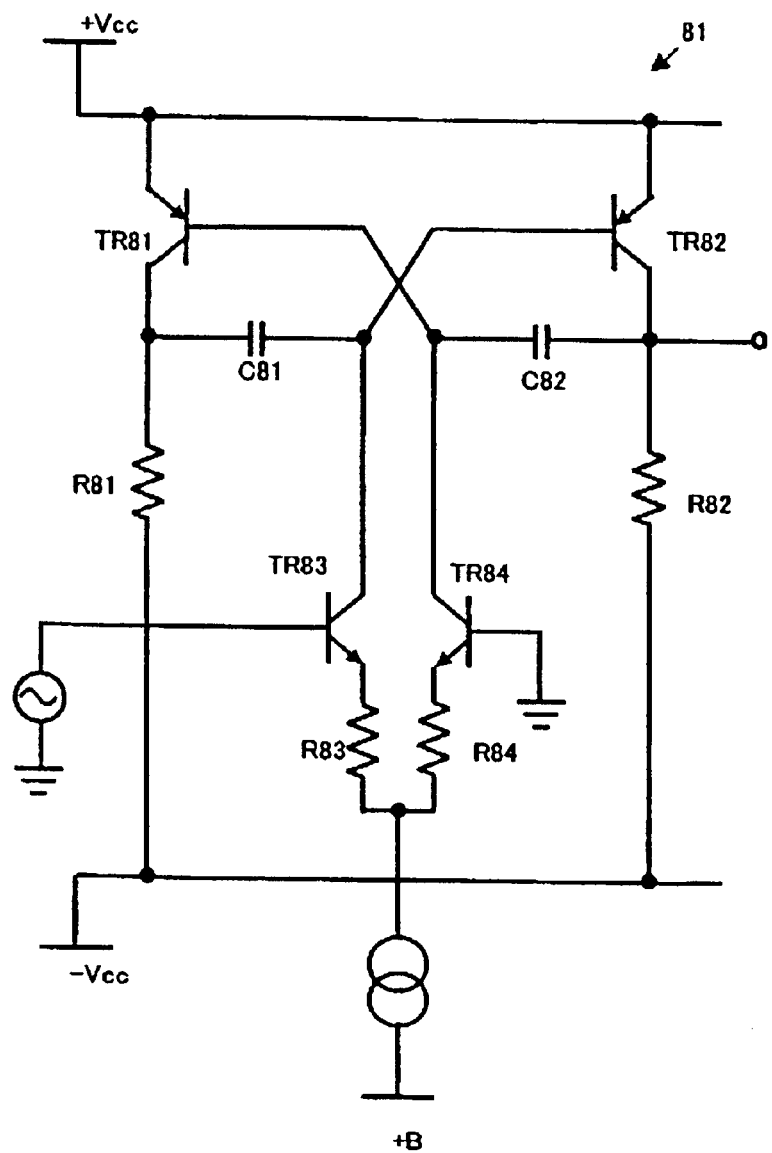
FIG. 8 is a circuit diagram illustrating another conventional pulse width modulation circuit.
Figure 9A:
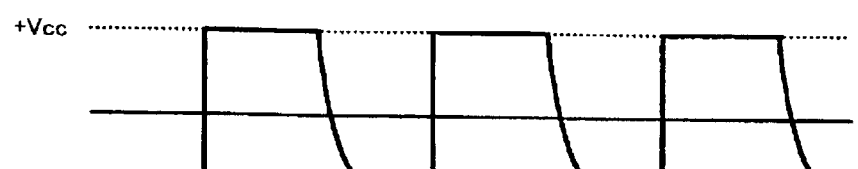
FIG. 9A and FIG. 9B are waveform diagrams illustrating the operation of the other conventional pulse width modulation circuit.
Figure 9B:
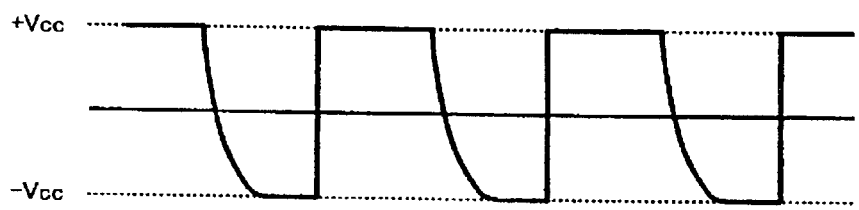

While a pulse width modulation circuit according to a preferred embodiment of the present invention has been described above, the present invention is not limited to this particular embodiment. For example, the falling edge of a pulse can be made sharp by adding first short circuit means 54 and second short circuit means 55 to the conventional pulse width modulation circuit 81 of FIG. 8, as illustrated in FIG. 5. In such a case, the first power supply is −Vcc and the second power supply is +Vcc. Thus, the first power supply voltage is lower than the second power supply voltage. Moreover, in the circuit diagram of FIG. 5, a resistor (or a circuit including a resistor and a condenser connected in parallel to each other) may alternatively be connected to the base of each of the transistors TR55 and TR56. Furthermore, a ground terminal may be used instead of the second power supply (i.e., −Vcc in FIG. 1, and +Vcc in FIG. 5).

As described above, the pulse width modulation circuit of the present invention includes the first short circuit means and the second short circuit means, whereby the rising (or falling) edge of the output pulse, which would otherwise be dull, can be made very sharp.

The present invention is readily applicable to any type of pulse width modulation circuits, including digital amplifiers, switching power supplies, and the like.

What is claimed is:

1. A pulse width modulation circuit, comprising:
    pulse generation means being provided with a first power supply and charged with a first current and a second current between which a constant current is distributed to turn ON/OFF a switching element, so as to generate a pulse from a first output section;
    pulse modulation means for controlling the charging by controlling a distribution ratio between the first current and the second current based on an input signal, so as to change a pulse width of the output pulse according to a charging time; and
    first short circuit means for shorting the first output section with the first power supply when the pulse being output from the first output section transitions to a voltage of the first power supply.

2. A pulse width modulation circuit according to claim 1, wherein:
    the pulse generation means comprises a first switching element connected to the first output section, and a second switching element; and
    the first short circuit means comprises a third switching element between the first output section and the first power supply, the first short circuit means shorting the first output section with the first power supply by turning ON the third switching element.

3. A pulse width modulation circuit according to claim 2, wherein the third switching element is turned ON in response to the second switching element being turned ON, and the third switching element is turned OFF in response to the second switching element being turned OFF.

4. A pulse width modulation circuit according to claim 2, wherein:
    the third switching element is a transistor; and
    a base of the third switching element is connected between the second switching element and the first power supply, an emitter thereof is connected to the first power supply, and a collector thereof is connected between the first switching element and the first power supply.

5. A pulse width modulation circuit according to claim 1, wherein:
    the pulse generation means further comprises a second output section, wherein the pulse generation means is charged with the first current and the second current to turn ON/OFF a switching element, so as to generate a pulse from the second output section; and the pulse width modulation circuit further comprises second short circuit means for shorting the second output section with the first power supply when the pulse being output from the second output section transitions to a voltage of the first power supply.

6. A pulse width modulation circuit according to claim 5, wherein:

the pulse generation means comprises a first switching element connected to the first output section, and a second switching element connected to the second output section;

the first short circuit means comprises a third switching element between the first output section and the first power supply, the first short circuit means shorting the first output section with the first power supply by turning ON the third switching element; and the second short circuit means comprises a fourth switching element between the second output section and the first power supply, the second short circuit means shorting the second output section with the first power supply by turning ON the fourth switching element.

7. A pulse width modulation circuit according to claim 6, wherein:

the third switching element is turned ON in response to the second switching element being turned ON, and the third switching element is turned OFF in response to the second switching element being turned OFF; and the fourth switching element is turned ON in response to the first switching element being turned ON, and the fourth switching element is turned OFF in response to the first switching element being turned OFF.

8. A pulse width modulation circuit according to claim 6, wherein:

the third switching element is a transistor;

a base of the third switching element is connected between the second switching element and the first power supply, an emitter thereof is connected to the first power supply, and a collector thereof is connected between the first switching element and the first power supply;

the fourth switching element is a transistor; and a base of the fourth switching element is connected between the first switching element and the first power supply, an emitter thereof is connected to the first power supply, and a collector thereof is connected between the second switching element and the first power supply.

9. A pulse width modulation circuit according to claim 1, wherein the pulse generation means comprises an astable multivibrator.

10. A pulse width modulation circuit according to claim 1, wherein:

the pulse generation means is provided further with a second power supply; and the voltage of the first power supply is set to be higher than that of the second power supply.

11. A pulse width modulation circuit according to claim 1, wherein:

the pulse generation means is provided further with a second power supply; and the voltage of the first power supply is set to be lower than that of the second power supply.

12. A pulse width modulation circuit according to claim 1, wherein:

the pulse generation means is provided further with a second power supply, and comprises a first transistor, a second transistor, a first condenser and a second condenser;

a collector of the first transistor is connected between one end of the first condenser and the first power supply, an emitter thereof is connected to the second power supply, and a base thereof is connected to one end of the second condenser; and a collector of the second transistor is connected between the other end of the second condenser and the first power supply, an emitter thereof is connected to the second power supply, and a base thereof is connected to the other end of the first condenser.

13. A pulse width modulation circuit according to claim 1, the pulse modulation means comprising:

a constant current circuit for generating a constant current;

a fifth transistor for receiving the input signal at its base to control the first current; and a sixth transistor for controlling the second current based on the first current.

* * * * *